(12) United States Patent
Sadd et al.

(10) Patent No.: US 9,779,795 B1
(45) Date of Patent: Oct. 3, 2017

(54) MAGNETIC RANDOM ACCESS MEMORY (MRAM) AND METHOD OF OPERATION

(71) Applicant: NXP USA, INC., Austin, TX (US)

(72) Inventors: Michael A. Sadd, Austin, TX (US); Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/356,879

(22) Filed: Nov. 21, 2016

(51) Int. Cl.
  *G11C 11/00* (2006.01)
  *G11C 11/16* (2006.01)
  *G11C 11/15* (2006.01)

(52) U.S. Cl.
  CPC .......... *G11C 11/1673* (2013.01); *G11C 11/15* (2013.01); *G11C 11/16* (2013.01); *G11C 11/1655* (2013.01); *G11C 11/1657* (2013.01); *G11C 11/1675* (2013.01)

(58) Field of Classification Search
  CPC ............ G11C 11/1673; G11C 11/1675; G11C 11/1655; G11C 11/1657; G11C 11/16; G11C 11/15
  See application file for complete search history.

(56) References Cited

U.S. PATENT DOCUMENTS

| | | | |
|---|---|---|---|
| 6,590,805 B2 | 7/2003 | Lu et al. | |
| 7,038,959 B2 * | 5/2006 | Garni | G11C 11/16 365/203 |
| 8,891,326 B1 | 11/2014 | Abedifard et al. | |
| 9,449,687 B1 * | 9/2016 | Piccardi | G11C 13/004 |
| 9,659,623 B1 * | 5/2017 | Sadd | G11C 11/1673 |
| 2006/0067149 A1 * | 3/2006 | Shimizu | G11C 7/062 365/210.1 |
| 2014/0003124 A1 * | 1/2014 | Youn | G11C 13/004 365/148 |
| 2014/0269031 A1 * | 9/2014 | Jung | G11C 11/1673 365/158 |
| 2015/0294706 A1 * | 10/2015 | Bonaccio | G11C 11/1673 365/158 |
| 2016/0078914 A1 * | 3/2016 | DeBrosse | G11C 11/1693 365/158 |

OTHER PUBLICATIONS

Otsuka, N. et al., "Circuit Techniques for 1.5-V Power Supply Flash Memory", IEEE Journal of Solid-State Circuits, vol. 32, No. 8, Aug. 1997, pp. 1217-1230.

* cited by examiner

Primary Examiner — Toan Le

(57) ABSTRACT

A memory device includes a first line coupled to a first terminal of a first memory cell, a second bit line coupled to a first terminal of a second memory cell, a sense amplifier coupled to a second end of the first bit line and a second end of the second bit line, a capacitor including a first terminal coupled to a first input of the sense amplifier and a second terminal coupled to a switch. The switch couples the second terminal of the capacitor to the second bit line during a calibration phase of a read operation and to the first bit line during a sense phase of the read operation. A current/voltage source drives current on the first bit line while the second line is floating during the calibration phase, and drives current on the second bit line while the first bit line is floating during the sense phase.

20 Claims, 8 Drawing Sheets

MAGNETIC RANDOM ACCESS MEMORY (MRAM) AND METHOD OF OPERATION

BACKGROUND

Field

This disclosure relates generally to memories, and more specifically, to sensing states of memory cells within a memory.

Related Art

Memory arrays are characterized by an array of memory cells, addressed in one direction by row (word line) decoding and in the other direction by column (bit line) decoding. The state of the memory cell in the read mode is sensed by applying a read voltage/current to a selected bit line and enabling a selected word line which selects a unique memory cell. The impedance difference of the memory cell relative to a reference memory cell (or a complementary memory cell written to the opposite state) is then sensed either using current sensing or voltage sensing techniques. Non-volatile memories (NVMs) are usually configured in large array blocks, leading to long bit lines. The consequence of long bit lines and dense layout leads to significant bit line metal resistance so that the metal resistance during sensing varies depending on which word line is selected. Also, with scaling, the variation of the bit line resistance increases (due, for example, to line roughness, CD variation, local and global variations) to a point where the conductance of the memory cell is of the same order as the bit line metal resistance. This becomes a problem when trying to sense the memory cell state without error. Therefore, there is a need for a sensing method which provides an improved read operation even in the presence of parasitic resistance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In order to mitigate the effects of parasitic array resistance, a memory architecture is used in which a current/voltage signal is forced on the bit line away from the end of the bit line connected to the sense amplifier. This creates a Kelvin like connection to the sense amplifier. As a result, the voltage drop from the force node of the bit line to the active cell being sensed does not impact the voltage sensed at the sense amplifier. Note that the sense amplifier is a voltage sensing amplifier which draws no DC current so that no current flows beyond the bit line contact to the active cell at the sense amplifier side of the bit line.

Examples of such a sensing operation will be described with respect to magnetic random access memory (MRAM). MRAMs are becoming increasingly popular, replacing flash memories. MRAMs provide system specification advantages of low energy writes, scaled macro sizes, fast write performance, and high cycling limit for writes. The memory states of an MRAM are characterized by the change in resistance of a resistive element, such as a magnetic tunnel junction (MTJ) element of a memory cell. However, due to process variations, the separation of the distributions of the memory states of an MRAM can be very small, making it challenging to differentiate different memory states. The problem of parasitic resistances further increases the challenges in properly detecting memory states. However, with the sensing operation described herein, small memory cell changes can be sensed even with high bit line resistance or resistance variation.

Figure 1:
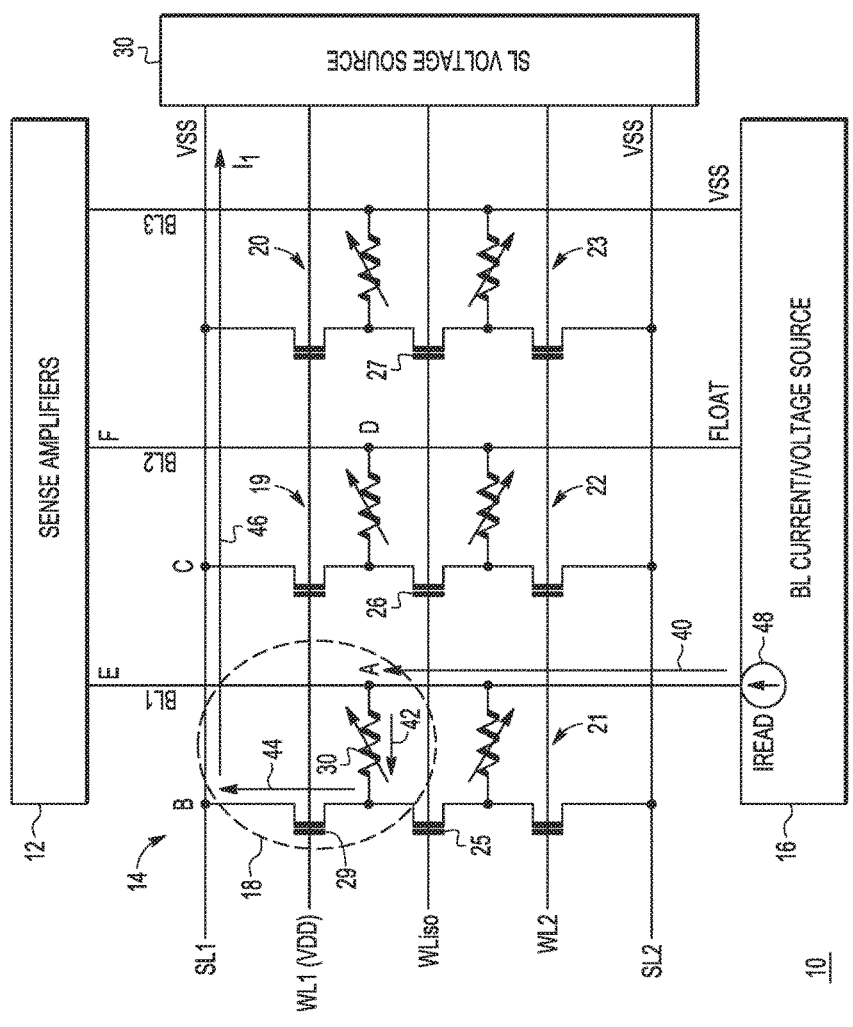
FIG. 1 illustrates, in partial block diagram form and partial schematic form, a memory in accordance with one embodiment of the present invention.

FIG. 1 illustrates a memory 10 (also referred to as a memory device). In the illustrated embodiment, memory 10 includes a memory array 14, a sense amplifier (amp) 12, a bit line (BL) current/voltage source 16, and a source line (SL) voltage source 30. Array 14 includes a plurality of memory cells 18-23. Each memory cell includes a transistor (an N-type transistor in the illustrated embodiment and also referred to as a select transistor) and a resistive memory element which stores a resistive state of the memory cell. In one embodiment, each resistive memory element is an MTJ in which a high resistive state (HRS) corresponds to a first resistive state of the cell and a low resistive state (LRS) corresponds to a second resistive state of the cell. Each memory cell is coupled to a corresponding SL, BL, and word line (WL). For example, memory cell 18 includes a transistor 29 and resistive element 30. A first current electrode of transistor 29 is coupled to a first SL, SL1, a control electrode is coupled to a first word line, WL1, and a second current electrode is coupled to a first terminal of resistive element 30. A second terminal of resistive element 30 is coupled to a first bit line, BL1. Therefore, in the illustrated embodiment, each of memory cells 18-20 is coupled to SL1 and WL1, and a corresponding BL of BL1-BL3. Similarly, each of memory cells 21-23 is coupled to SL2 and WL2, and a corresponding BL of BL1-BL3.

Memory cells in adjacent rows have an isolation transistor coupled in between adjacent memory cells. For example, isolation transistor 25 has a first current electrode coupled to memory cell 18 and a second current electrode coupled to memory cell 21 and a control electrode coupled to a WL isolation signal, WLiso. Similarly, isolation transistor 26 has a first current electrode coupled to memory cell 19 and a second current electrode coupled to memory cell 22 and a control electrode coupled to WLiso. Isolation transistor 27 has a first current electrode coupled to memory cell 20 and a second current electrode coupled to memory cell 23 and a control electrode coupled to WLiso.

Each BL has a first end (also referred to as a force node) coupled to BL current/voltage source 16, and a corresponding second end (also referred to as the sense node), opposite the first end, coupled to sense amp 12. SL1-SL2 are coupled to SL voltage source 30. Memory array 14 may include any number of word lines and bit lines, and thus any number of memory cells.

FIG. 1 will be used to explain how voltage across a selected memory cell can be determined using a Kelvin type connection. In the example of FIG. 1, it is assumed that memory cell 18 is selected by the activation of the selected word line, WL1. That is, WL1, when selected, is coupled to a first voltage supply node, VDD. SL1 and SL2 are coupled to a second voltage supply node, VSS, and during a read, WLiso is also biased, for example, at ground, to isolate resistive elements in neighboring cells along the bit line. The selected bit line for a read operation of memory cell 18 is BL1. A current source 48 is coupled to BL1 such that a read current is forced onto BL1 at the force node. The adjacent bit line, BL2, is left floating in that BL2 is not driven from outside the array itself, and the other bit lines, e.g. BL3, are coupled to VSS. A current, as indicated by arrows 40, 42, 44, and 46, runs from current source 48, through node A, through resistive element 30, through node B, and through SL1 (and node C) to VSS. The voltage at node A is equal to the voltage at node E. This is due to the fact that sense amp 12 is a voltage sensing amplifier which draws no DC current. The distance from node B to node C is small therefore there is a small added voltage drop, but the voltage at node B is approximately equal to that of node C. Since no current is drawn on BL2, the voltage at node D is equal to the voltage at node C. Again, since sense amp 12 draws no current, the voltage at node F equals the voltage at node D.

Therefore nodes E and F, at the sense nodes located at opposite ends of the bit lines from the force nodes, provide Kelvin probes to accurately measure the voltage across resistive element 30. That is, the difference in voltage at nodes E and F (VE−VF) provides the voltage across the resistive element 30 of selected memory cell 18. Since the voltage at one end of resistive element 30 (at node A) and the voltage at one end of select transistor 20 (node B) are available at sense amp 12 (at nodes E and F), the parasitic resistance on the BL1 from BL current/voltage source 16 to memory cell 18 and the parasitic resistance on SL1 from SL voltage source 30 to memory cell 18 are mitigated and do not affect the voltage measurement.

Figure 2:
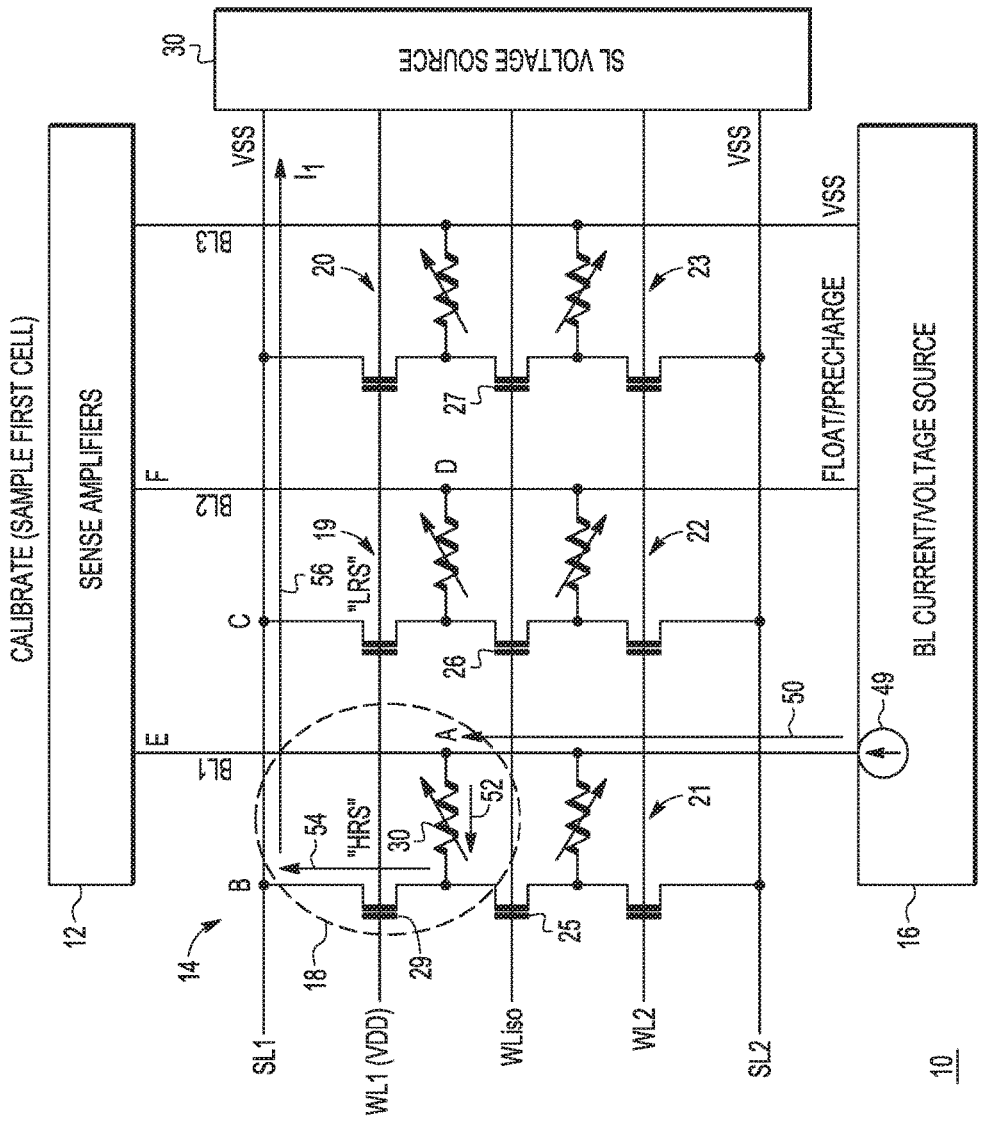
FIG. 2 illustrates in schematic form, the memory of FIG. 1 during a calibrate phase of a read operation, in accordance with one embodiment of the present invention.
Figure 3:
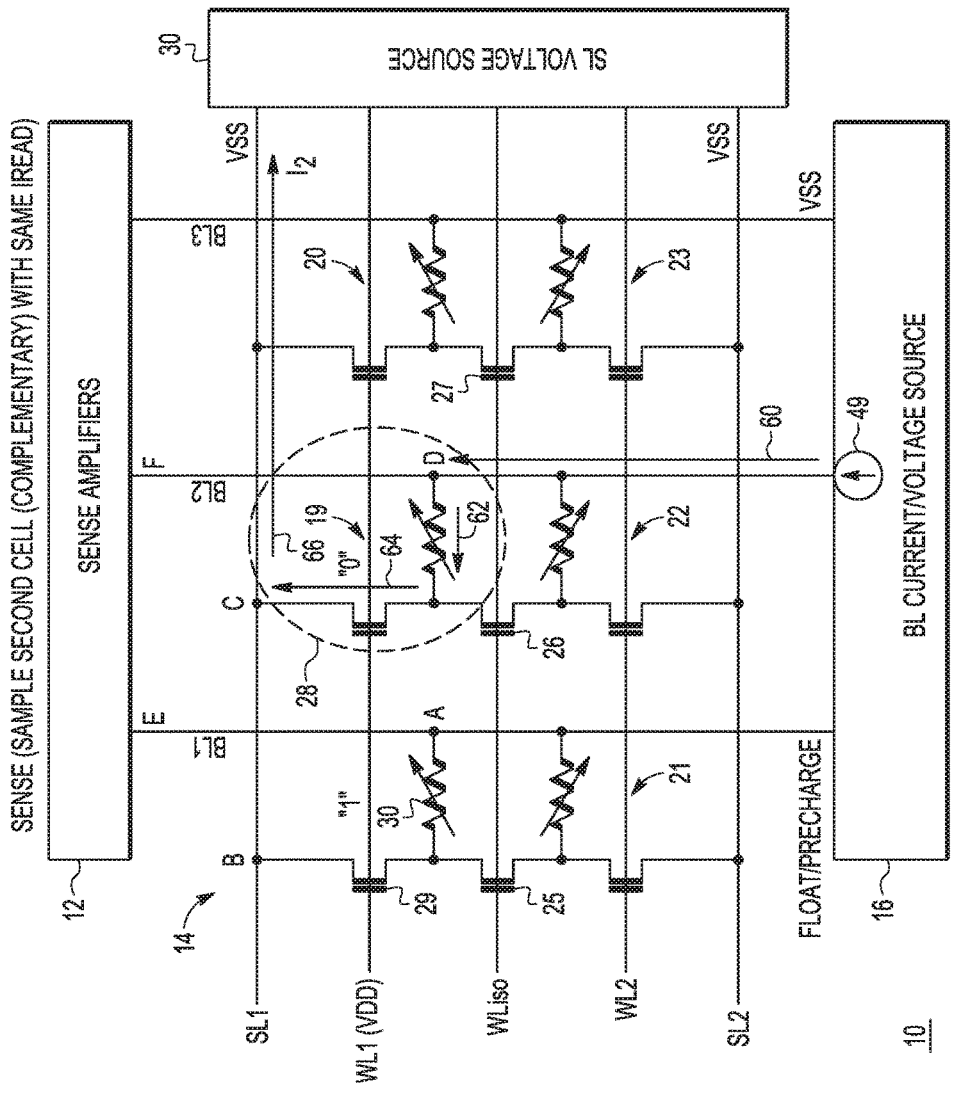
FIG. 3 illustrates in schematic form, the memory of FIG. 1 during a sense phase of a read operation, in accordance with one embodiment of the present invention.

FIGS. 2 and 3 illustrate memory 10 during a read operation using differential sensing in, accordance with one embodiment of the present invention. With differential sensing, two resistive elements (of two memory cells) are programmed with opposite resistive states to provide a memory cell logic state. For example, in reference to the differential sensing examples of FIGS. 2 and 3, memory cells 18 and 19 are programmed to provide a one bit memory cell state. One resistive element of one of the memory cells is programmed to a high resistive state (HRS) and the other one to a low resistive state (LRS). In the illustrated embodiment, the resistive element of memory cell 18 is programmed to a HRS and the resistive element of memory cell 19 is programmed to a LRS. In this example, this corresponds to memory cells 18 and 19, together, providing a logic state of a "0", such that a "0" will be sensed by sense amp 12. If the resistive element of memory cell 18 were programmed to a LRS and the resistive element of memory element of memory cell 19 were programmed to a HRS, memory cells 18 and 19 together provide a logic state of "1", such that a "1" would be sensed by sense amp 12. As will be described in more detail below, a read operation has a calibrate phase, illustrated in FIG. 2, and a sense phase, as illustrated in FIG. 3.

Figure 4:
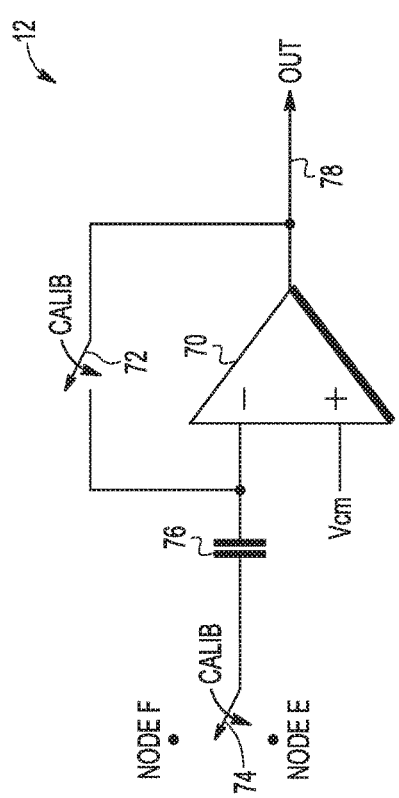
FIG. 4 illustrates in partial block diagram form and partial diagram form, the sense amplifier of FIGS. 1-3, in accordance with one embodiment of the present invention.

FIG. 4 illustrates a more detailed view of a portion of sense amp 12. Sense amp 12 includes an amplifier 70, a capacitor 76, and switches 72 and 74. A first terminal of switch 74 is coupled to node E, a second terminal of switch 74 is coupled to node F, and a third terminal of switch 74 is coupled to a first electrode of capacitor 76. A second electrode of capacitor 76 is coupled to a negative input of amplifier 70 and to a first terminal of switch 72. A positive input of amplifier 70 is coupled to a bias voltage, Vcm, that may be near the common mode of amplifier 70. An output of amplifier 70 is coupled to a second terminal of switch 72. Switches 74 and 72 are coupled to receive a calibrate signal, CALIB, at control inputs. With respect to switch 74, when CALIB is asserted, the first electrode of capacitor 76 is coupled to Node E and when CALIB is negated, the first electrode of capacitor 76 is coupled to node F. With respect to switch 72, when CALIB is asserted, the output of amplifier 70 is coupled to the negative input of amplifier 70, and when CALIB is negated, the output of amplifier 70 is decoupled from the negative input (and the second electrode of capacitor 76). Three-terminal switch 74 may be implemented as a compound switch including one two-terminal switch coupling capacitor 76 to node F when CALIB is asserted but is open otherwise, and a second two-terminal switch coupling capacitor 76 to node E when CALIB is negated but is open otherwise. Because the non-inverting input of amplifier 70 is coupled to a DC bias, Vcm, amplifier 70 may be implemented as a single input inverting amplifier.

Referring now to FIGS. 2 and 4, during the calibrate phase, CALIB is asserted such that the first electrode of capacitor 76 is coupled to BL1 at node E, and the output of amplifier 70 is shorted to the negative input of amplifier 70. A current source 49 is coupled to BL1 so as to force a read current at the force node of BL1, while BL2 floats or alternatively is pre-charged in preparation for the next operation. A current, as indicated by arrows 50, 52, 54, and 56, runs from current source 49, through node A, through resistive element 30, through node B, and through SL1 (and node C) to VSS. This current, during the calibrate phase, charges capacitor 76. During the calibration phase, the closing of switch 72 provides for cancellation of input offset in amplifier 70. After a time sufficient for capacitor 76 to charge, the calibrate phase ends and the sense phase begins.

Referring to FIGS. 3 and 4, for the sense phase, CALIB is deasserted. In this example, the timing is such that switch 72 first decouples the output of amplifier 70 from the negative input of amplifier 70, and then switch 74 couples node F to the first electrode of capacitor 76. At this point, the same read current is forced onto BL2, while BL1 floats or is allowed to discharge. To ensure it is the same read current forced on BL1 during the calibrate phase, the same current source 49 can be used to force a read current on BL2. Therefore, a current, as indicated by arrows 60, 62, 64, and 66, runs from current source 49, through node D, through the resistive element of memory cell 19, through node C, and through SL1 to VSS. This current is provided to capacitor 76, which already has stored in it the voltage at node E (=voltage at node B) during the calibrate phase. Therefore, depending on the state of memory cell 19 and the read current, the output of amplifier 70 will be tripped high or low based on the voltage at node F (=voltage at node A) compared to the voltage at node E (=voltage at node B). That is, sense amp 12 senses the change in voltage across capacitor 76 between nodes E and F.

In the illustrated example, if memory cell 18 and memory cell 19 are at a HRS and LRS, respectively, the output of amplifier 70 goes high during the sense phase, and if memory cell 18 and memory cell 19 are at a LRS and HRS, respectively, the output of amplifier 70 goes low during the sense phase. In the current embodiment, during the sense phase, memory cell 18 and memory cell 19, together, are sensed as a logic level "0" when the output of amplifier 70 is low and are sensed as a logic level "1" when the output of amplifier 70 is high.

Figure 5:
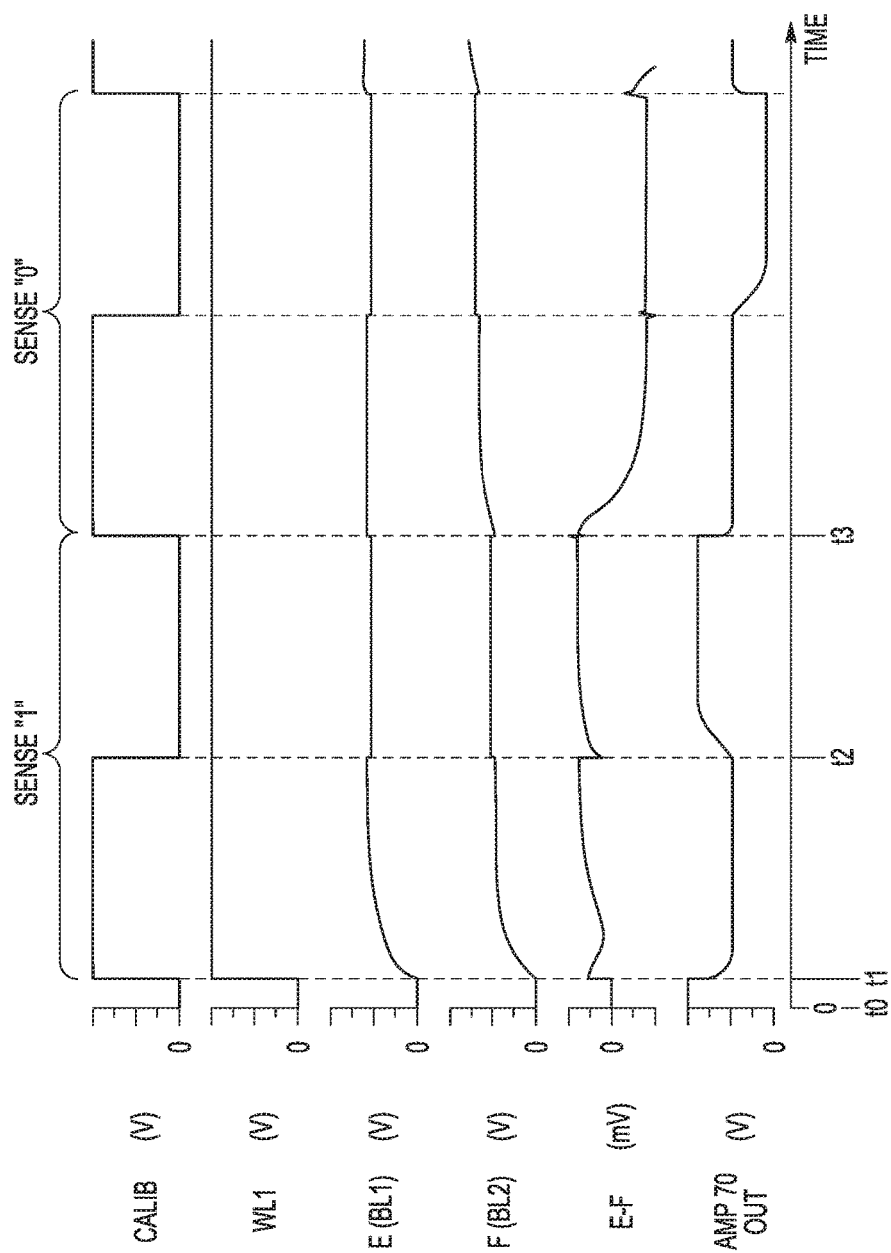
FIG. 5 illustrates a timing diagram of various signals of the memory of FIGS. 1-4, in accordance with one embodiment of the present invention.

FIG. 5 illustrates a timing diagram of operation of the memory of FIGS. 2 and 3 in accordance with one embodiment. During a first period between time t1 and t2, CALIB is asserted, indicating a calibration phase. Also WL1 is activated. The voltage at node E, corresponding to BL1, rise as charge gets stored on capacitor 76 through node E. Then, for a second time period between time t2 and t3, CALIB is negated, indicating a sense phase. During the sense phase, the second electrode of capacitor 76 gets switched to node F, and the curve illustrating "node E−node F" is seen going positive, indicating that the voltage at node E is greater than the voltage at node F. Therefore, the output of amplifier 70 goes high. In this example, with memory cell 18 in a HRS and memory cell 19 in a LRS, a logic level 1 is sensed. The remainder of FIG. 5 illustrates a calibrate phase and subsequent sense phase for the case in which a logic level 0 is sensed. In this case, during the calibration phase, "node E−node F" is seen going negative, indicating that the voltage at node F is greater than the voltage at node E due to memory cell 18 having a LRS and memory cell 19 having a HRS. Therefore, the output of amplifier 70 goes low indicating a logic level 0 is sensed.

Therefore, through the use of a sense amp which draws no DC bit line current, Kelvin connections can be utilized to differentially sense the voltages at nodes E and F to effectively sense the difference of voltages at nodes B and C. In alternate embodiments, a multiple stage (e.g. two stage) amplifier can be used for amplifier 70. Furthermore, one or more stages may be an inverting stage.

Figure 6:
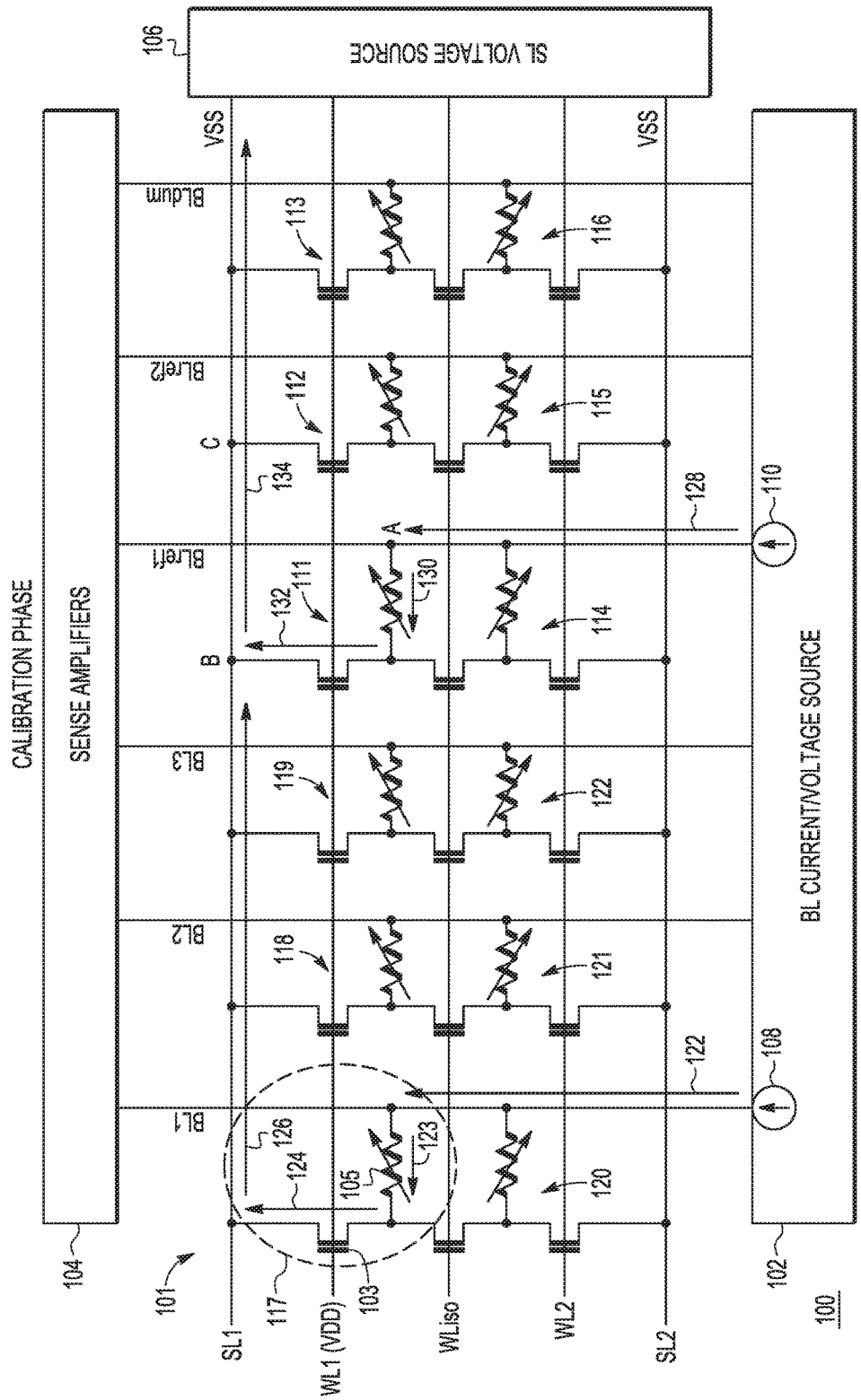
FIG. 6 illustrates in schematic form, a memory during a calibrate phase of a read operation, in accordance with another embodiment of the present invention.
Figure 7:
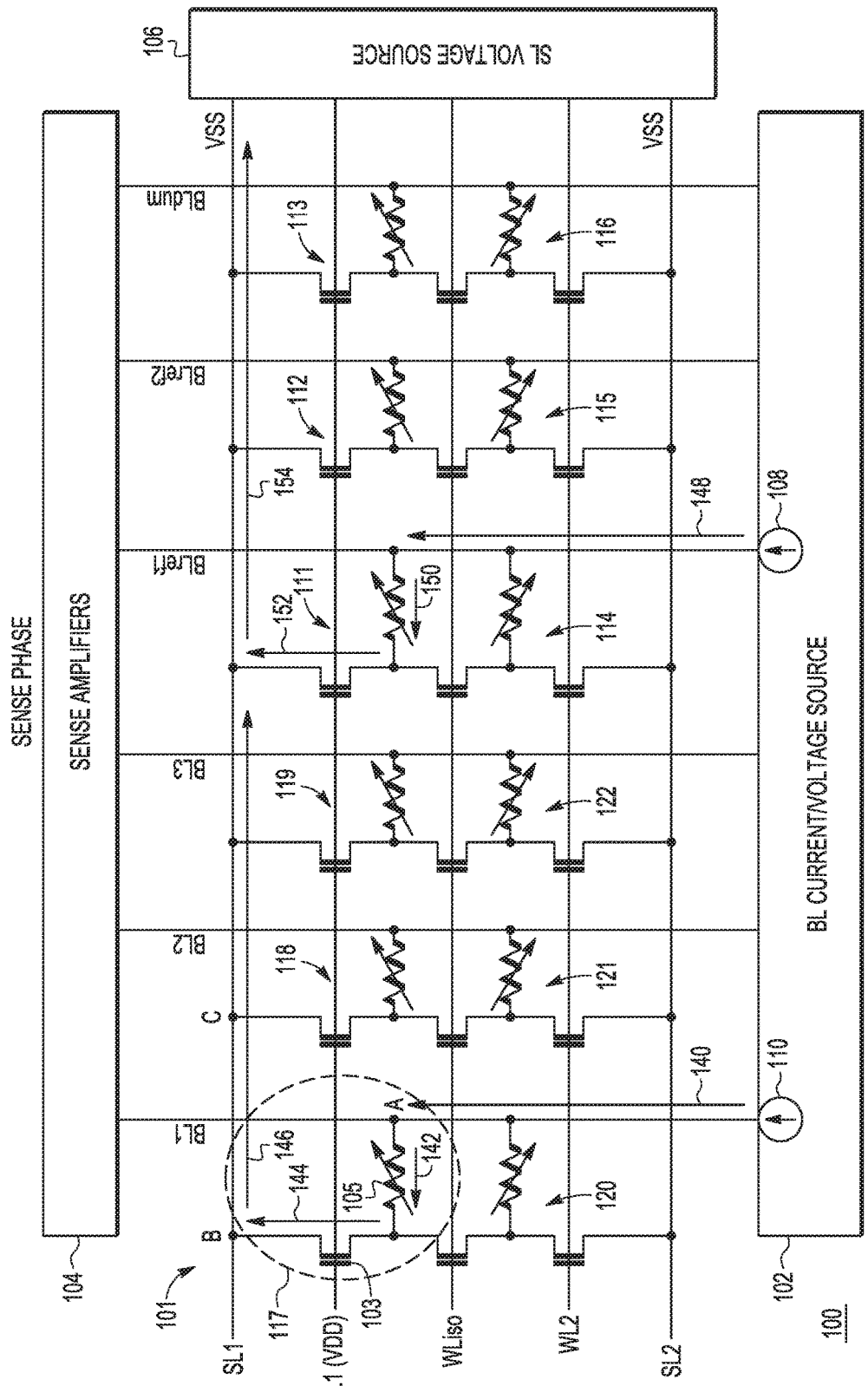
FIG. 7 illustrates in schematic form, the memory of FIG. 6 during a sense phase of a read operation, in accordance with another embodiment of the present invention.

FIGS. 6 and 7 illustrate a memory 100 (also referred to as a memory device) which compares the memory cell to a reference cell rather than differential sensing as described with FIGS. 2 and 3. In the illustrated embodiment of FIG. 6, memory 100 includes a memory array 101, a sense amplifier (amp) 104, a bit line (BL) current/voltage source 102, and a source line (SL) voltage source 106. Array 101 includes a plurality of memory cells 117-122 and a plurality of reference cells 111, 112, 114, and 115. Cells 113 and 116, coupled to BLdum, serve to terminate the array. Each cell includes a transistor (an N-type transistor in the illustrated embodiment and also referred to as a select transistor) and a resistive memory element which stores a resistive state of the memory cell. In one embodiment, each resistive memory element is an MTJ in which a high resistive state (HRS) corresponds to a first resistive state of the cell and a low resistive state (LRS) corresponds to a second resistive state of the cell. The resistive elements in the reference cells are typically set to a resistance value between the HRS and the LRS, and may be constructed of multiple resistive elements.

Each memory and reference cell is coupled to a corresponding SL, BL, and word line (WL). For example, memory cell 117 includes transistor 103 and resistive element 105. A first current electrode of transistor 103 is coupled to a first SL, SL1, a control electrode is coupled to a first word line, WL1, and a second current electrode is coupled to a first terminal of resistive element 105. A second terminal of resistive element 105 is coupled to a first bit line, BL1. Therefore, in the illustrated embodiment, each of memory cells 117-119 is coupled to SL1 and WL1, and a corresponding BL of BL1-BL3. Similarly, each of memory cells 120-122 is coupled to SL2 and WL2, and a corresponding BL of BL1-BL3. Each reference cell 111-113 is coupled to SL1, WL1, and a corresponding reference BL of BLref1 and BLref2. Similarly, each of reference memory cells 114-116 is coupled to SL2, WL2, and a corresponding reference BL of BLref1 and BLref2.

Memory and reference cells in adjacent rows have an isolation transistor coupled in between adjacent memory cells, as described above in reference to memory array 14. Therefore, the control electrode of each isolation transistor is coupled to a WL isolation signal, WLiso.

Similar to array 14, each BL (including the reference bit lines) has a first end (also referred to as a force node) coupled to BL current/voltage source 102, and a corresponding second end (also referred to as the sense node), opposite the first end, coupled to sense amp 104. SL1-SL2 are coupled to SL voltage source 106. Memory array 101 may include any number of word lines and bit lines, and thus any number of memory cells and any number of reference cells.

Figure 8:
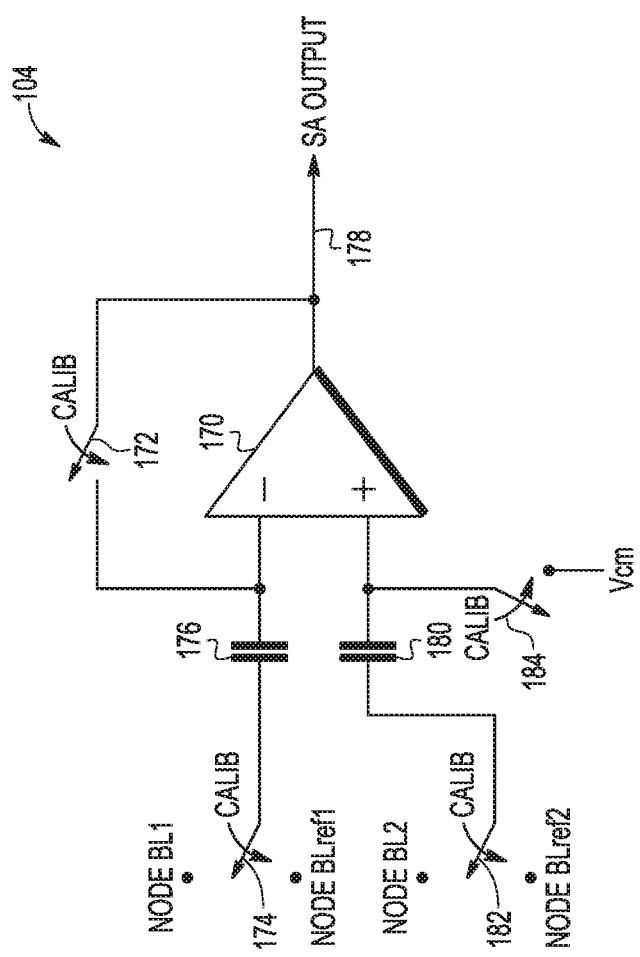
FIG. 8 illustrates in partial block diagram form and partial diagram form, the sense amplifier of FIGS. 6 and 7, in accordance with one embodiment of the present invention.

The same principles described above with respect to FIG. 1 and the Kelvin type connections apply here to the embodiments of FIGS. 6-8. FIGS. 6 and 7 illustrate memory 100 during a read operation using single ended sensing in accordance with one embodiment of the present invention. With single ended sensing, each resistive element is programmed with a resistive state (LRS or HRS) which represents the memory cell logic state. That is, unlike the differential sensing example of FIGS. 2 and 3, only a single memory cell is needed to store a one bit logic state. In this case, though, a reference cell is also used for sensing the state of the memory cell. A HRS of the resistive element may refer to a logic state of 1 and a LRS to a logic state of 0, or vice versa.

FIG. 8 illustrates a more detailed view of a portion of sense amp 104. Sense amp 104 includes an amplifier 170, a capacitor 176, a capacitor 184, and switches 172, 174, 182, and 184. A first terminal of switch 174 is coupled to Node BL1, a second terminal of switch 174 is coupled to Node BLref1, and a third terminal of switch 174 is coupled to a first electrode of capacitor 176. A second electrode of capacitor 176 is coupled to a negative input of amplifier 170 and to a first terminal of switch 172. An output of amplifier 170, SA OUTPUT, is coupled to a second terminal of switch 172. A first terminal of switch 182 is coupled to Node BL2, a second terminal of switch 182 is coupled to Node BLref2, and a third terminal of switch 182 is coupled to a first electrode of capacitor 180. A second electrode of capacitor 180 is coupled to a positive input of amplifier 170 and to a first terminal of switch 184. A second terminal of switch 184 is coupled to a bias voltage, Vcm, that may be near the common mode of amplifier 170.

Switches 174, 172, 182, and 184 are coupled to receive a calibrate signal, CALIB, at control inputs. With respect to switch 174, when CALIB is asserted, the first electrode of capacitor 176 is coupled to Node BLref1 and when CALIB is negated, the first electrode of capacitor 176 is coupled to Node BL1. With respect to switch 182, when CALIB is asserted, the first electrode of capacitor 180 is coupled to Node BLref2 and when CALIB is negated, the first electrode of capacitor 180 is coupled to Node BL2. With respect to switch 172, when CALIB is asserted, the output of amplifier 170 is coupled to the negative input of amplifier 170, and when CALIB is negated, the output of amplifier 170 is decoupled from the negative input (and the second electrode of capacitor 176). With respect to switch 184, when CALIB is asserted, the positive input of amplifier 170 is coupled to Vcm, and when CALIB is negated, the positive input of amplifier 170 is decoupled from Vcm.

Referring now to FIGS. 6 and 8, during the calibrate phase, CALIB is asserted such that the first electrode of capacitor 176 is coupled to Node BLref1, the output of amplifier 170 is shorted to the negative input of amplifier 170, and the positive input of amplifier 170 is coupled to Vcm. A current source 110 is coupled to BLref1 so as to force a read current at the force node of BLref1. A current, as indicated by arrows 128, 130, 132, and 134, runs from current source 110, through node A, through the resistive element of reference cell 111, through node B, and through SL1 (and node C) to VSS. This current, during the calibrate phase, charges capacitor 176 via Node BLref1 and charges capacitor 180 via Node BLref2. A current mirror 108 provides a similar current as current source 110 to the force node of BL1. This current, as indicated by arrows 122, 123, 124, and 126, precharges BL1 (the cell BL) close to the final level to prepare the node for the next operation. Current source 110 could also be coupled to the BL1 to provide this current. However, due to the distance along SL1 between BLref1 and BL1, current mirror 108 can instead be used to force the same current onto BL1. Due to the configuration of amplifier 170, with the charging of capacitors 176 and 180, amplifier 170 is placed in a high gain mode where it is ready to trip. After a time sufficient for capacitors 176 and 180 to charge, the calibrate phase ends and the sense phase begins.

For the sense phase, CALIB is deasserted. In this example, the timing is such that switch 172 first decouples the output of amplifier 70 from the negative input of amplifier 170, and then switch 174 couples Node BL1 to the first electrode of capacitor 176, switch 182 couples Node BL2 to the first electrode of capacitor 180, and switch 184 decouples the negative input of amplifier 170 from Vcm. At this point, the same read current is forced onto BL1. To ensure it is the same read current forced on BLref1 during the calibrate phase, the same current source 110 can be used to force a read current on BL1. A current, as indicated by arrows 140, 142, 144, and 146, runs from current source 110, through node A, through resistive element 105, through node B, and through SL1 (and node C) to VSS. This current is provided to capacitor 176 via Node BL1 and to capacitor 180 via Node BL2.

Note that capacitor 176 already has stored in it the voltage at Node BLref1 during the calibration phase, and capacitor 180 already has stored in the voltage at Node BLref2 during the calibration phase. Therefore, depending on the state of memory cell 117 and reference cell 111, the output of amplifier 170 will be tripped high or low. Amplifier 170 senses the difference between the voltage at node BL2 (referred to as VBL2) minus the voltage at node BLref2 (referred to as VBLref2) and the voltage at node BL1 (referred to as VBL1) minus the voltage at node BLref2 (referred to as VBLref2). That is, the output of amplifier 170 provides Gain*[(VBL2−VBLref2)−(VBL1−VBLref1)]. In one embodiment, if the output of amplifier 170 goes low, a logic state of "1" is sensed and if the output of amplifier 170 goes high, a logic state of "0" is sensed.

Current mirror 108 is used to provide a similar current as current source 110 onto BLref1 during the sense phase. This current, as indicated by arrows 148, 150, 152, and 154, precharges the BLref1 (the reference BL) close to the final level for the next cycle.

Therefore, through the use of a sense amp which draws no DC current, Kelvin connections can be utilized to sense the voltages at nodes BL1, BL2, BLref1, and BLref2 to effectively perform single ended sensing of the resistive elements of the memory cells and reference cells. In alternate embodiments, a multiple stage (e.g. two stage) amplifier can be used for amplifier 170. Furthermore, one or more stages may be an inverting stage By now it should be appreciated how coupling sense amplifiers to sense nodes at opposite ends of the bit lines from the force nodes at the BL current/voltage source allows for a Kelvin type connection which provides accurate sensing of voltages over the resistive elements. Further, such a Kelvin type set up can be used for any type of memory which requires voltage sensing over a storage element. That is, the force nodes at one end of the bit lines which receive the read currents can be placed at opposite ends of the bit lines from the sense nodes which are coupled to the sense amplifiers. For example, although the discussion herein is focused on MRAM memories utilizing MTJ elements, it should be appreciated that the similar cell operation, cell layout, and sensing method can be applied to any resistive-type memory cells, such as resistive RAMs (RRAMs), phase-change memories (PCMs) and the like, or can be applied to any other type of memory cells. In this manner, parasitic resistances, such as those on SL, do not impact reads and improved accuracy in can be achieved.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of system 10 are circuitry located on a single integrated circuit or within a same device. Alternatively, system 10 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the source lines may be routed parallel or perpendicular to the bit lines according to different configurations. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a memory device includes a first bit line including a first end and a second end; a first memory cell coupled between the first end and the second end of the first bit line; a current source coupled to the first end of the first bit line; a sense amplifier coupled to the second end of the first bit line; a second bit line including a first end and a second end; a second memory cell coupled between the first end and the second end of the second bit line; the current source coupled to the first end of the second bit line; the sense amplifier coupled to the second end of the second bit line; a first capacitive element including a first terminal and a second terminal, the first terminal coupled to a first input of the sense amplifier; and a first switch coupled to the second terminal of the first capacitive element, wherein the first switch is placed in a first position during a first phase of operation during which current is driven on the first end of the first bit line while voltage is measured on the second end of the first bit line, and the first switch is placed in a second position during a second phase of operation during which current is driven on the first end of the second bit line while voltage is measured on the second end of the second bit line. In one aspect, the first input of the sense amplifier is an inverting input and a second input of the sense amplifier is a non-inverting input coupled to a supply voltage. In another aspect, the memory device further includes a first word line; and a first source line; wherein the first memory cell is coupled to the first bit line, the first word line and the first source line, and the second memory cell is coupled to the second bit line, the first word line and the first source line. In a further aspect, the first memory cell includes a resistive storage element including a first terminal coupled to the first bit line and a second terminal coupled to a first current electrode of an access transistor, and the access transistor further includes a gate electrode coupled to the first word line and a second current electrode coupled to the first source line. In yet a further aspect, the second memory cell includes a resistive storage element including a first terminal coupled to the second bit line and a second terminal coupled to a first current electrode of an access transistor, and the access transistor further includes a gate electrode coupled to the first word line and a second current electrode coupled to the first source line. In another further aspect, during the first phase of operation the second bit line is pre-charged, and during the second phase of operation the first bit line is pre-charged. In another aspect of this embodiment, the memory device further includes a third bit line including a first end, and a second end coupled to the sense amplifier; a fourth bit line including a first end, and a second end coupled to the sense amplifier; a second capacitive element including a first terminal and a second terminal, the first terminal coupled to a second input of the sense amplifier; and a second switch coupled to the second terminal of the second capacitive element, wherein the second switch is placed in a first position during the first phase of operation during which current is driven on the first end of the second bit line while voltage is measured on the second end of the second bit line and the second end of the fourth bit line, and the second switch is placed in a second position during the second phase of operation during which current is also driven on the first end of the third bit line while voltage is measured on the second end of the first bit line and the second end of the third bit line. In a further aspect, the memory device further includes a third switch including a first terminal coupled to the first terminal of the second capacitive element and the second input to the sense amplifier, and a second terminal coupled to ground, wherein the third switch is closed during the first phase of operation. In yet another aspect of this embodiment, the memory device further includes a fourth switch including a first terminal coupled to an output of the sense amplifier and a second terminal coupled to the first terminal of the first capacitive element and the first input of the sense amplifier, wherein the third switch is closed during the first phase of operation.

Another embodiment includes a method of operating a memory device including during a read operation: placing a first switch in a first position during a calibration phase of the read operation; driving current on a first end of a first bit line while voltage is measured by a sense amplifier on a second end of the first bit line during the calibration phase, wherein the first bit line is coupled to a first terminal of a first cell in the memory device and a capacitor is coupled between the first input to the sense amplifier and the first bit line while the voltage is measured on the second end of the first bit line; placing the first switch in a second position during a sense phase of the read operation; driving current on a first end of a second bit line while voltage is measured by the sense amplifier on a second end of the second bit line during the sense phase, wherein the second bit line is coupled to a first terminal of a second cell in the memory device and the capacitor is coupled between the first input to the sense amplifier and the second bit line while the voltage is measured on the second end of the second bit line. In one aspect, the method further includes pre-charging the second bit line before the current is driven on the first bit line; and pre-charging the first bit line before the current is driven on the second bit line. In another aspect, the method further includes placing a second switch in a first position during the calibration phase; driving the current on the first end of the first bit line and a first end of the second bit line while voltage is measured by the sense amplifier on the second end of the second bit line and a second end of a third bit line during the calibration phase; placing the second switch in a second position during the sense phase; and driving the current on the first end of the first bit line and the first end of the second bit line while voltage is measured by the sense amplifier on the second end of the first bit line and the second end of a fourth bit line during the sense phase. In yet another aspect, the second bit line is coupled to a first terminal of a second memory cell and the capacitor is coupled between the first input to the sense amplifier and the second bit line while the voltage is measured on the second end of the second bit line. In a further aspect, the third bit line is coupled to a first terminal of a third cell in the memory device and a second capacitor is coupled between the first input to the sense amplifier and the third bit line while the voltage is measured on the second end of the third bit line. In yet another aspect of this another embodiment, the method further includes coupling an output of the sense amplifier to the first input of the sense amplifier during the calibration phase; and decoupling the output of the sense amplifier from the first input of the sense amplifier during the sense phase. In a further aspect, the method further includes coupling a second input of the sense amplifier to a bias during the calibration phase; and decoupling the second input of the sense amplifier from the bias during the sense phase.

Yet another embodiment includes a memory device including a first memory cell including a first terminal and a second terminal; a first bit line coupled to the first terminal of the first memory cell; a second memory cell including a first terminal and a second terminal; a second bit line coupled to the first terminal of the second memory cell; a sense amplifier coupled to a second end of the first bit line and a second end of the second bit line; a capacitor including a first terminal coupled to a first input of the sense amplifier and a second terminal coupled to a switch, wherein the switch is configured to couple the second terminal of the capacitor to the second bit line during a calibration phase of a read operation and to the first bit line during a sense phase of the read operation; and a current/voltage source coupled to a first end of the first bit line and a first end of the second bit line, wherein the current/voltage source is configured to drive current on the first bit line during the calibration phase, and to drive current on the second bit line during the sense phase. In one aspect of this yet another embodiment, the memory device further includes a source line voltage source; a source line coupled to the source line voltage source, the second terminal of the first memory cell, and the second terminal of the second memory cell. In yet a further aspect, the memory device further includes the first memory cell includes a first resistive storage element and a first access transistor, wherein the first resistive storage element includes a first contact coupled to the first terminal of the first memory cell and a second contact coupled to a first current electrode of the first access transistor; the first access transistor further includes a second current electrode coupled to the second terminal of the first memory cell, and a gate electrode coupled to a first word line; the second memory cell includes a second resistive storage element and a second access transistor, wherein the second resistive storage element includes a first contact coupled to the first terminal of the second memory cell and a second contact coupled to a first current electrode of the second access transistor; and the second access transistor further includes a second current electrode coupled to the second terminal of the second memory cell, and a gate electrode coupled to the first word line. In another aspect, the memory device further includes a third bit line including a first end coupled to the current/voltage source, and a second end coupled to the sense amplifier; a fourth bit line including a first end coupled to the current/voltage source, and a second end coupled to the sense amplifier; a second capacitive element including a first terminal and a second terminal, the first terminal is coupled to a second input of the sense amplifier and the second terminal is coupled to a second switch, wherein the second switch is configured to couple the second terminal of the capacitor to the fourth bit line during the calibration phase of the read operation and to the third bit line during the sense phase of the read operation; and the sense amplifier is configured to sense voltage at the second ends of the second and fourth bit lines during the calibration phase, and to sense voltage at the second ends of the first and third bit lines during the sense phase.

What is claimed is:

1. A memory device comprising:
a first bit line including a first end and a second end;
a first memory cell coupled between the first end and the second end of the first bit line;
a current source coupled to the first end of the first bit line;
a sense amplifier coupled to the second end of the first bit line;
a second bit line including a first end and a second end;
a second memory cell coupled between the first end and the second end of the second bit line;
the current source coupled to the first end of the second bit line;
the sense amplifier coupled to the second end of the second bit line;
a first capacitive element including a first terminal and a second terminal, the first terminal coupled to a first input of the sense amplifier; and
a first switch coupled to the second terminal of the first capacitive element, wherein
the first switch is placed in a first position during a first phase of operation during which current is driven on the first end of the first bit line while voltage is measured on the second end of the first bit line, and
the first switch is placed in a second position during a second phase of operation during which current is driven on the first end of the second bit line while voltage is measured on the second end of the second bit line.

2. The memory device of claim 1 wherein:
the first input of the sense amplifier is an inverting input; and
a second input of the sense amplifier is a non-inverting input coupled to a supply voltage.

3. The memory device of claim 1 further comprising:
a first word line; and
a first source line;
wherein
the first memory cell is coupled to the first bit line, the first word line and the first source line, and the second memory cell is coupled to the second bit line, the first word line and the first source line.

4. The memory device of claim 3 wherein:
the first memory cell includes
a resistive storage element including a first terminal coupled to the first bit line and a second terminal coupled to a first current electrode of an access transistor, and
the access transistor further includes a gate electrode coupled to the first word line and a second current electrode coupled to the first source line.

5. The memory device of claim 4 wherein:
the second memory cell includes
a resistive storage element including a first terminal coupled to the second bit line and a second terminal coupled to a first current electrode of an access transistor, and
the access transistor further includes a gate electrode coupled to the first word line and a second current electrode coupled to the first source line.

6. The memory device of claim 4 wherein:
during the first phase of operation the second bit line is pre-charged, and
during the second phase of operation the first bit line is pre-charged.

7. The memory device of claim 1 further comprising:
a third bit line including a first end, and a second end coupled to the sense amplifier;
a fourth bit line including a first end, and a second end coupled to the sense amplifier;
a second capacitive element including a first terminal and a second terminal, the first terminal coupled to a second input of the sense amplifier; and
a second switch coupled to the second terminal of the second capacitive element,
wherein
the second switch is placed in a first position during the first phase of operation during which current is driven on the first end of the second bit line while voltage is measured on the second end of the second bit line and the second end of the fourth bit line, and
the second switch is placed in a second position during the second phase of operation during which current is also driven on the first end of the third bit line while voltage is measured on the second end of the first bit line and the second end of the third bit line.

8. The memory device of claim 7 further comprising:
a third switch including a first terminal coupled to the first terminal of the second capacitive element and the second input to the sense amplifier, and a second terminal coupled to ground, wherein the third switch is closed during the first phase of operation.

9. The memory device of claim 1 further comprising:
a fourth switch including a first terminal coupled to an output of the sense amplifier and a second terminal coupled to the first terminal of the first capacitive element and the first input of the sense amplifier, wherein the third switch is closed during the first phase of operation.

10. A method of operating a memory device comprising:
during a read operation:
placing a first switch in a first position during a calibration phase of the read operation;
driving current on a first end of a first bit line while voltage is measured by a sense amplifier on a second end of the first bit line during the calibration phase, wherein the first bit line is coupled to a first terminal of a first cell in the memory device and a capacitor is coupled between the first input to the sense amplifier and the first bit line while the voltage is measured on the second end of the first bit line;
placing the first switch in a second position during a sense phase of the read operation;
driving current on a first end of a second bit line while voltage is measured by the sense amplifier on a second end of the second bit line during the sense phase, wherein the second bit line is coupled to a first terminal of a second cell in the memory device and the capacitor is coupled between the first input to the sense amplifier and the second bit line while the voltage is measured on the second end of the second bit line.

11. The method of claim 10 further comprising:
pre-charging the second bit line before the current is driven on the first bit line; and
pre-charging the first bit line before the current is driven on the second bit line.

12. The method of claim 10 further comprising:
placing a second switch in a first position during the calibration phase;
driving the current on the first end of the first bit line (BL1) and a first end of the second bit line while voltage is measured by the sense amplifier on the second end of the second bit line and a second end of a third bit line during the calibration phase;
placing the second switch in a second position during the sense phase; and
driving the current on the first end of the first bit line and the first end of the second bit line while voltage is measured by the sense amplifier on the second end of the first bit line and the second end of a fourth bit line during the sense phase.

13. The method of claim 10 wherein the second bit line is coupled to a first terminal of a second memory cell and the capacitor is coupled between the first input to the sense amplifier and the second bit line while the voltage is measured on the second end of the second bit line.

14. The method of claim 12 wherein the third bit line is coupled to a first terminal of a third cell in the memory device and a second capacitor is coupled between the first input to the sense amplifier and the third bit line while the voltage is measured on the second end of the third bit line.

15. The method of claim 10 further comprising:
coupling an output of the sense amplifier to the first input of the sense amplifier during the calibration phase; and
decoupling the output of the sense amplifier from the first input of the sense amplifier during the sense phase.

16. The method of claim 12 further comprising:
coupling a second input of the sense amplifier to a bias during the calibration phase; and
decoupling the second input of the sense amplifier from the bias during the sense phase.

17. A memory device comprising:
a first memory cell including a first terminal and a second terminal;
a first bit line coupled to the first terminal of the first memory cell;
a second memory cell including a first terminal and a second terminal;
a second bit line coupled to the first terminal of the second memory cell;
a sense amplifier coupled to a second end of the first bit line and a second end of the second bit line;

a capacitor including a first terminal coupled to a first input of the sense amplifier and a second terminal coupled to a switch, wherein the switch is configured to couple the second terminal of the capacitor to the second bit line during a calibration phase of a read operation and to the first bit line during a sense phase of the read operation; and a current/voltage source coupled to a first end of the first bit line and a first end of the second bit line, wherein the current/voltage source is configured to drive current on the first bit line during the calibration phase, and to drive current on the second bit line during the sense phase.

18. The memory device of claim 17 further comprising:
a source line voltage source;
a source line coupled to the source line voltage source, the second terminal of the first memory cell, and the second terminal of the second memory cell.

19. The memory device of claim 18 further comprising:
the first memory cell includes a first resistive storage element and a first access transistor, wherein
    the first resistive storage element includes a first contact coupled to the first terminal of the first memory cell and a second contact coupled to a first current electrode of the first access transistor;
    the first access transistor further includes a second current electrode coupled to the second terminal of the first memory cell, and a gate electrode coupled to a first word line;
the second memory cell includes a second resistive storage element and a second access transistor, wherein
    the second resistive storage element includes a first contact coupled to the first terminal of the second memory cell and a second contact coupled to a first current electrode of the second access transistor; and
    the second access transistor further includes a second current electrode coupled to the second terminal of the second memory cell, and a gate electrode coupled to the first word line.

20. The memory device of claim 17 further comprising:
a third bit line including a first end coupled to the current/voltage source, and a second end coupled to the sense amplifier;
a fourth bit line including a first end coupled to the current/voltage source, and a second end coupled to the sense amplifier;
a second capacitive element including a first terminal and a second terminal, the first terminal is coupled to a second input of the sense amplifier and the second terminal is coupled to a second switch, wherein
    the second switch is configured to couple the second terminal of the capacitor to the fourth bit line during the calibration phase of the read operation and to the third bit line during the sense phase of the read operation; and
    the sense amplifier is configured to sense voltage at the second ends of the second and fourth bit lines during the calibration phase, and to sense voltage at the second ends of the first and third bit lines during the sense phase.

* * * * *